United States Patent
Liu et al.

[11] Patent Number: 5,831,297
[45] Date of Patent: Nov. 3, 1998

[54] STRUCTURE OF METAL-INSULATOR-SEMICONDUCTOR-LIKE MUTIPLE-NEGATIVE-DIFFERENTIAL-RESISTANCE DEVICE

[75] Inventors: Wen-Chau Liu; Lih-Wen Laih, both of Tainan, Taiwan

[73] Assignee: National Science Council, Taipei, Taiwan

[21] Appl. No.: 835,172

[22] Filed: Apr. 7, 1997

[30] Foreign Application Priority Data

Jan. 18, 1997 [TW] Taiwan ................... 86100499

[51] Int. Cl.⁶ .................................... H01L 29/88
[52] U.S. Cl. .................. 257/200; 257/96; 257/97; 257/280; 257/614; 257/655; 257/657
[58] Field of Search ................ 257/94–99, 200, 257/280, 614, 655, 657

[56] References Cited

U.S. PATENT DOCUMENTS

| | | | |
|---|---|---|---|
| 4,857,971 | 8/1989 | Burnham | 257/200 |
| 5,506,423 | 4/1996 | Saeki | 257/200 |
| 5,633,516 | 5/1997 | Mishima et al. | 257/200 |
| 5,701,020 | 12/1997 | Liu et al. | 257/280 |

FOREIGN PATENT DOCUMENTS

404129231 A  4/1992  Japan ........................ 257/200

*Primary Examiner*—Tom Thomas
*Assistant Examiner*—Fetsum Abraham
*Attorney, Agent, or Firm*—Townsend and Townsend and Crew LLP

[57] ABSTRACT

The present invention provides a structure of a metal-insulator-semiconductor (MIS)-like multiple-negative-differential-resistance (MNDR) device and the fabrication method thereof. The device of the present invention has the characteristics of dual-route and MNDR at low temperatures. These characteristics result from the successive barrier-lowering and potential-redistribution effect when conducting carriers fall into a quantum well. MNDR devices have excellent potential in multiple-value logic circuitry applications and are capable of reducing circuitry complexity.

7 Claims, 7 Drawing Sheets

STRUCTURE OF METAL-INSULATOR-SEMICONDUCTOR-LIKE MUTIPLE-NEGATIVE-DIFFERENTIAL-RESISTANCE DEVICE

BACKGROUND OF THE INVENTION

1. Field of the Invention

The present invention relates to a structure of an MNDR device and fabrication method thereof, and especially relates to a structure of an MIS-like MNDR device and fabrication method thereof.

2. Description of the Related Art

In recent years, MNDR devices have attracted much interest for applications in microwave and logic circuits. In the quest to facilitate current circuitry design, MNDR, which can simplify circuitry design and reduce circuitry complexity is of great interest. In practice, multiple-switching behavior of MNDR devices is the main reason that they are so effective. GaAs—InGaAs MIS-like structure with stepping quantum well represents one kind of MNDR device. The related reference is given by: [1] D. C. Y. Chang, C. L. Lee, and T. F. Lei, "Switching characteristics of MINPN devices," Solid-State Electron., vol. 32, pp. 179–189, 1989; [2] S. S. Lu and Y. J. Wang, "A GSMBE grown $In_{0.49}Ga_{0.51}P/GaAs$ narrow base DHBT exhibiting N-shaped negative resistance with peak-to-valley current ratio up $1\times10^{17}$ at room temperature," IEEE Electron Device Lett., vol. 15, no. 2, pp 60–62, 1994; [3] C. L. Wu, W. C. Hsu, H. M. Shieh and M. S. Tsai, "A novel δ doped GaAs/InGaAs real-space transfer transistor with high peak-to-valley ratio and high current driving capability," IEEE Electron Device Lett., vol. 16, pp. 112–114, 1995; [4] E. F. Schrbert, J. E. Cunningham, and W. T. Tsang, "Perpendicular electric transport in doping superlattices," Appl. Phys. Lett., vol. 51, pp. 817–819, 1987; [5] W. S. Lour and W. C. Liu, "Negative-differential-resistance (NDR) superlattice-emitter transistor," Jpn. J. Appl. Phys., vol. 30, pp. L564–L567, 1991; and [6] W. C. Liu, L. W. Laih, J. H. Tsai, K. W. Lin, and C. C. Cheng, "Multi-Route Current-Voltage (I–V) Characteristics of GaAs—InGaAs Metal-Insulator Semiconductor-Like(MIS) Structure for Multiple-Valued Logic Application," IEEE Journal of Quantum Electrons Vol. 32, No. 9, 1996.

SUMMARY OF THE INVENTION

Thus, there is a need to provide a structure of a device and a fabrication method thereof which has excellent potential for multiple-value logic circuit applications and is capable of reducing circuitry complexity.

One objective of the present invention is to provide a structure of an MIS-like MNDR device and fabrication method thereof wherein the MNDR device has excellent potential for multiple-value logic circuit applications and is capable of reducing circuitry complexity.

Another objective of the present invention is to provide a structure of an MIS-like MNDR device and fabrication method thereof wherein the MIS device has the characteristics of dual-route and MNDR at low temperatures.

In order to archive the objectives, the present invention provides a structure of an MIS-like MNDR device and fabrication method thereof wherein the MIS device has the characteristics of dual-route and MNDR at low temperatures. The device of the present invention is formed on a wafer formed of high n-doping GaAs. The structure of the present invention comprises: an n-doping GaAs layer, formed on the wafer, having a thickness of 5000Å; an n-doping InGaAs layer, formed on the n-doping GaAs layer, having a thickness of 200Å and a doping concentration of $1\times10^{16}$ cm$^{-3}$; an n-doping GaAs layer, formed on the n-doping InGaAs layer, having a thickness of 150Å and a doping concentration of $1\times10^{16}$ cm$^{-3}$; an Au layer, evaporated on the n-doping GaAs layer; and an Au—Ge—Ni alloy layer, evaporated on the back surface of the wafer. The method of the present invention comprises: forming an n-doping GaAS layer having a thickness of 5000Å on a wafer; forming an n-doping InGaAS layer having a thickness of 200Å and a doping concentration of $1\times10^{16}$ cm$^{-3}$ on the n-doping GaAs layer; forming an n-doping GaAs layer having a thickness of 150Å and a doping concentration of $1\times10^{16}$ cm$^{-3}$ on the n-doping InGaAs layer; evaporating an Au layer on the n-doping GaAs layer; and evaporating an Au—Ge—Ni alloy layer on the back surface of the wafer.

DESCRIPTION OF THE DRAWINGS

Other objectives, features, and advantages of the present invention will become apparent from the following detailed description made with reference to an illustrative but non-limiting embodiment. The description is made with reference to the accompanying drawings, in which.

DESCRIPTION OF THE PREFERRED EMBODIMENT

Figure 1:
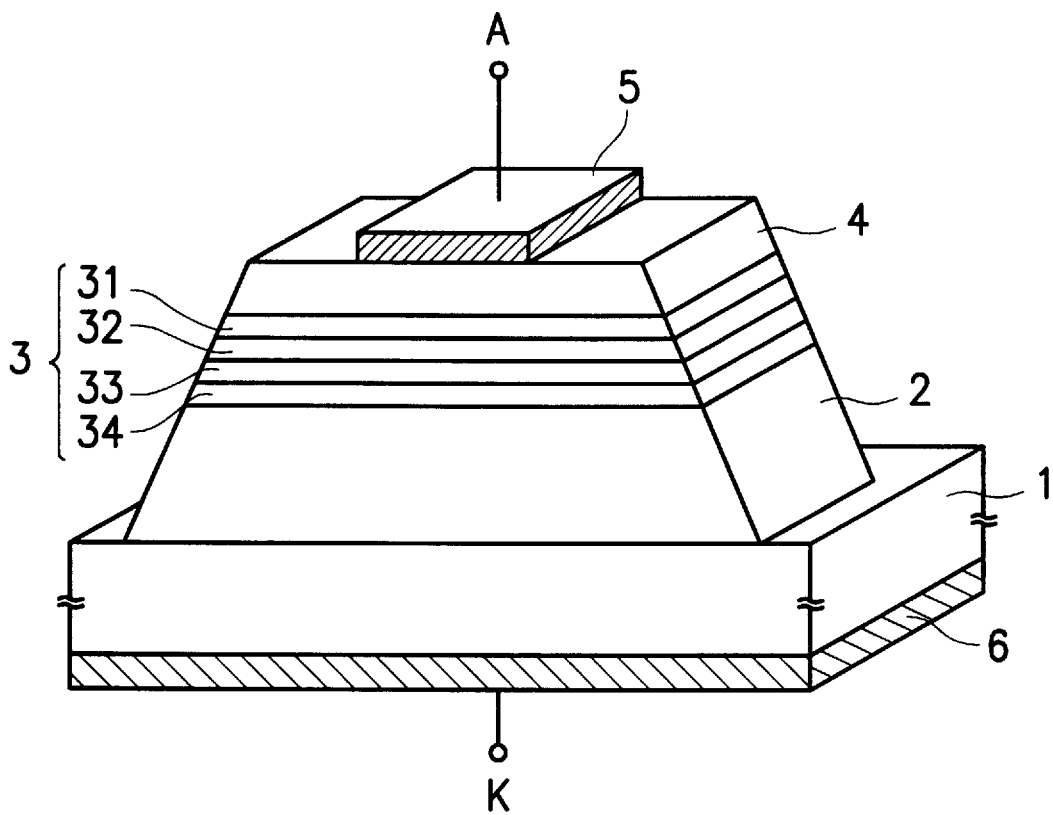
FIG. 1 shows a structure of the device of the present invention.
Figure 2A:
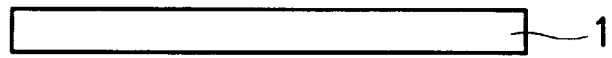
FIG. 2A to FIG. 2F shows a process of the device of the present invention.
Figure 2B:
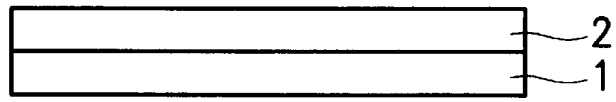
Figure 2C:
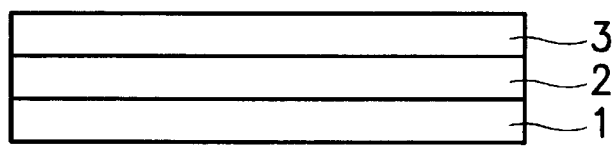
Figure 2D:
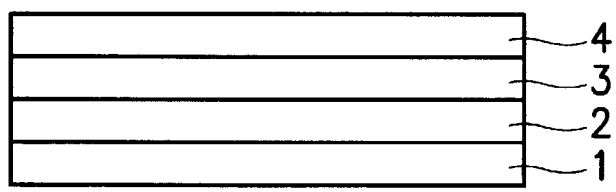
Figure 2E:
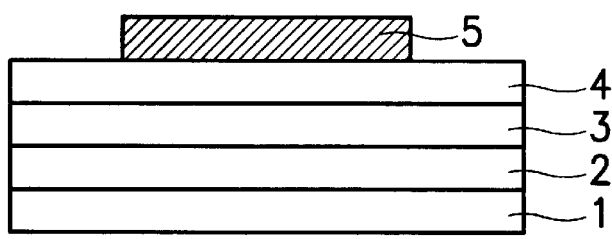
Figure 2F:
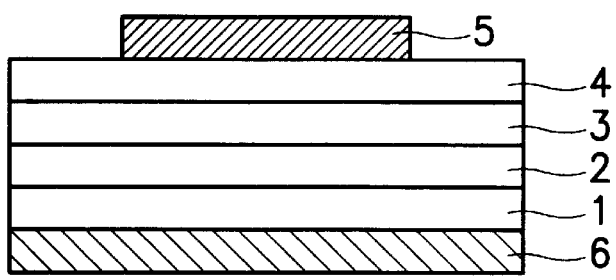

FIG. 1 shows a structure of the device of the present invention. As shown in FIG. 1, the device of the present invention is formed on a wafer 1 made of high n-doping GaAs. The structure of the present invention comprises: an n-doping GaAs layer 2, formed on the wafer 1, having a thickness of 5000Å, serving as a buffer layer; an n-doping $In_xGa_{1-x}$As layer 3, formed on the n-doping GaAs layer 2, having a thickness of 200Å and a doping concentration of $1\times10^{16}$ cm$^{-3}$ and serving as a quantum well; an n-doping GaAs layer 4, formed on the n-doping InGaAs layer 3, having a thickness of 150Å and a doping concentration of $1\times10^{16}$ cm$^{-3}$; an Au layer 5, formed on the n-doping GaAs layer 4 by an evaporation method; and an Au—Ge—Ni alloy layer 6, formed on the back surface of the wafer 1 by an evaporation method.

As shown in FIG. 2A to FIG. 2F, the fabrication method of the present invention comprises: providing a wafer 1 formed of high n-doping GaAs; forming an n-doping GaAS layer 2 having a thickness of 5000Å on the wafer 1 and serving as a buffer layer; forming an n-doping $In_xGa_{1-x}$As layer 3 having a thickness of 200Å and a doping concentration of $1 \times 10^{16}$ cm$^{-3}$ on the n-doping GaAs layer 2, wherein the n-doping In$_x$Ga$_{1-x}$As layer 3 serves as a quantum well; forming an n-doping GaAs layer 4 having a thickness of 150Å and a doping concentration of $1 \times 10^{16}$ cm$^{-3}$ on the n-doping InGaAs layer 3; evaporating an Au layer 5 on the n-doping GaAs layer 4, wherein the Au layer 5 serves as an anode; and evaporating an Au—Ge—Ni alloy layer 6 on the back surface of the wafer 1, wherein the Au—Ge—Ni alloy layer 6 serves as a cathode.

Figure 3:
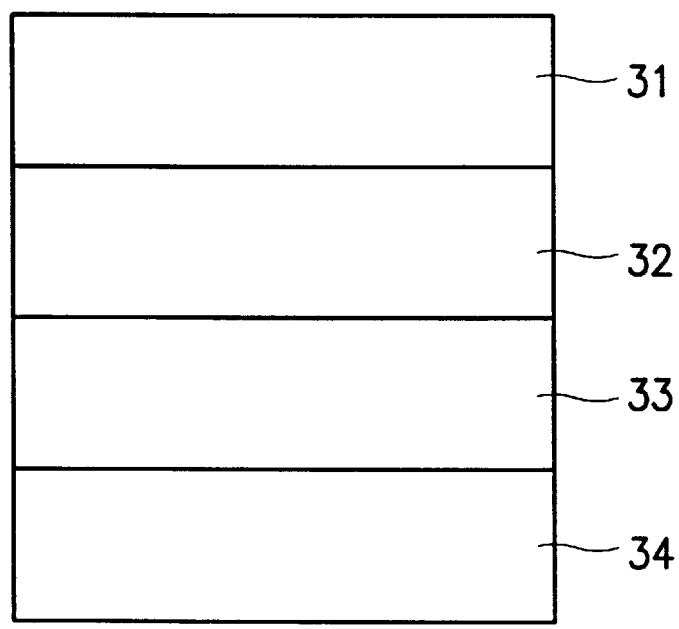
FIG. 3 shows a structure of n-$In_xGa_{1-x}$As layer shown in FIG. 1.

FIG. 3 shows a structure of n-In$_x$Ga$_{1-x}$As layer 3 which serves as a quantum well. As shown in FIG. 3, the quantum well, which produces the dual-route and MNDR characteristics of the present invention, is formed of four subwells (SWs) 31, 32, 33, 34, each of the same thickness (50Å) and the same doping concentration but different molar ratios of In and Ga. The molar ratios of In and Ga in four SWs 31, 32, 33, and 34 are respectively 20:80, 15:85, 10:90, and 5:95.

Figure 4:
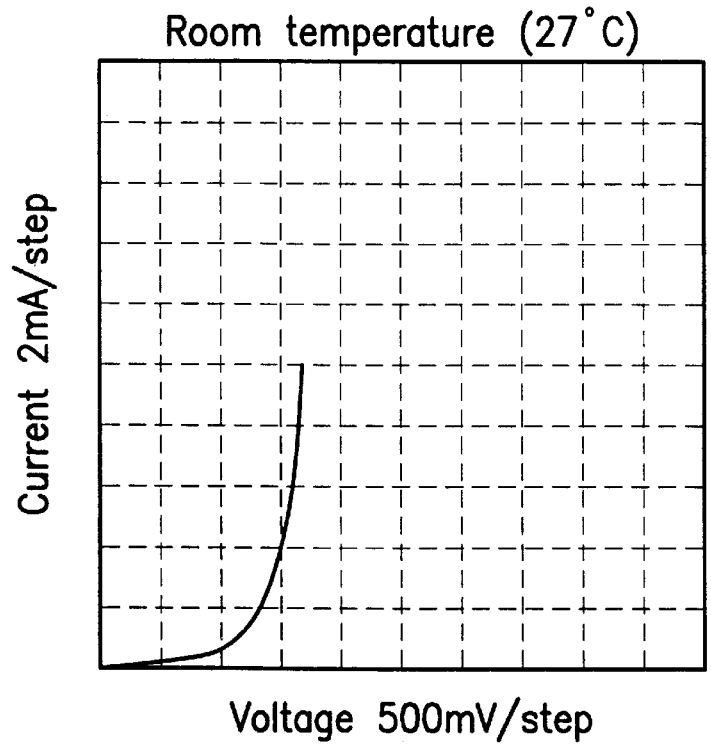
FIG. 4 shows the characteristics of the device of the present invention at room temperature (27° C.)
Figure 5:
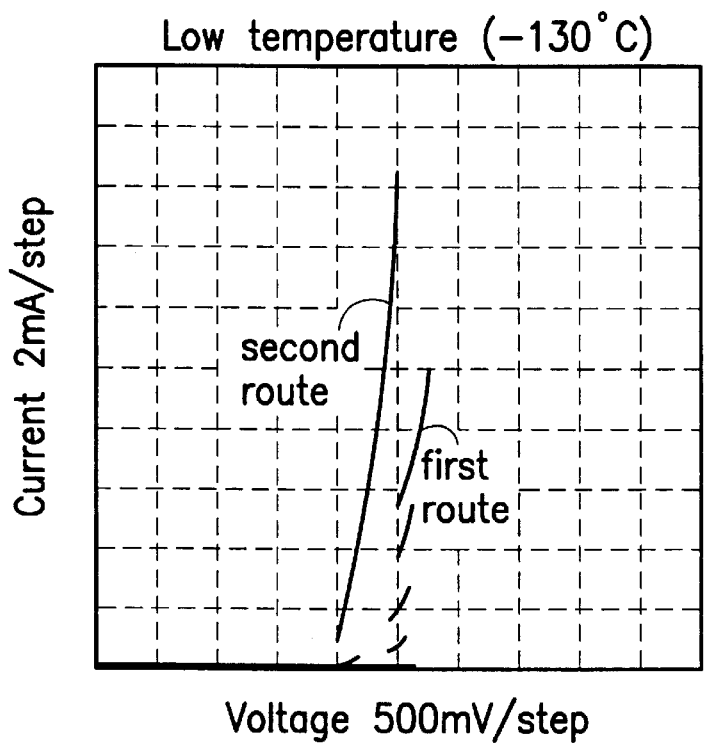
FIG. 5 shows the characteristics of the device of the present invention at low temperature (−130° C.)

FIG. 4 shows the characteristics of the device of the present invention at a room temperature (27° C.). FIG. 5 shows the characteristics of the device of the present invention at a low temperature (−130° C.). As shown in FIG. 5, it is known that the dual-route characteristic appears at low temperature. The reason why the dual-route characteristic appears at low temperature will be explained below.

Figure 6:
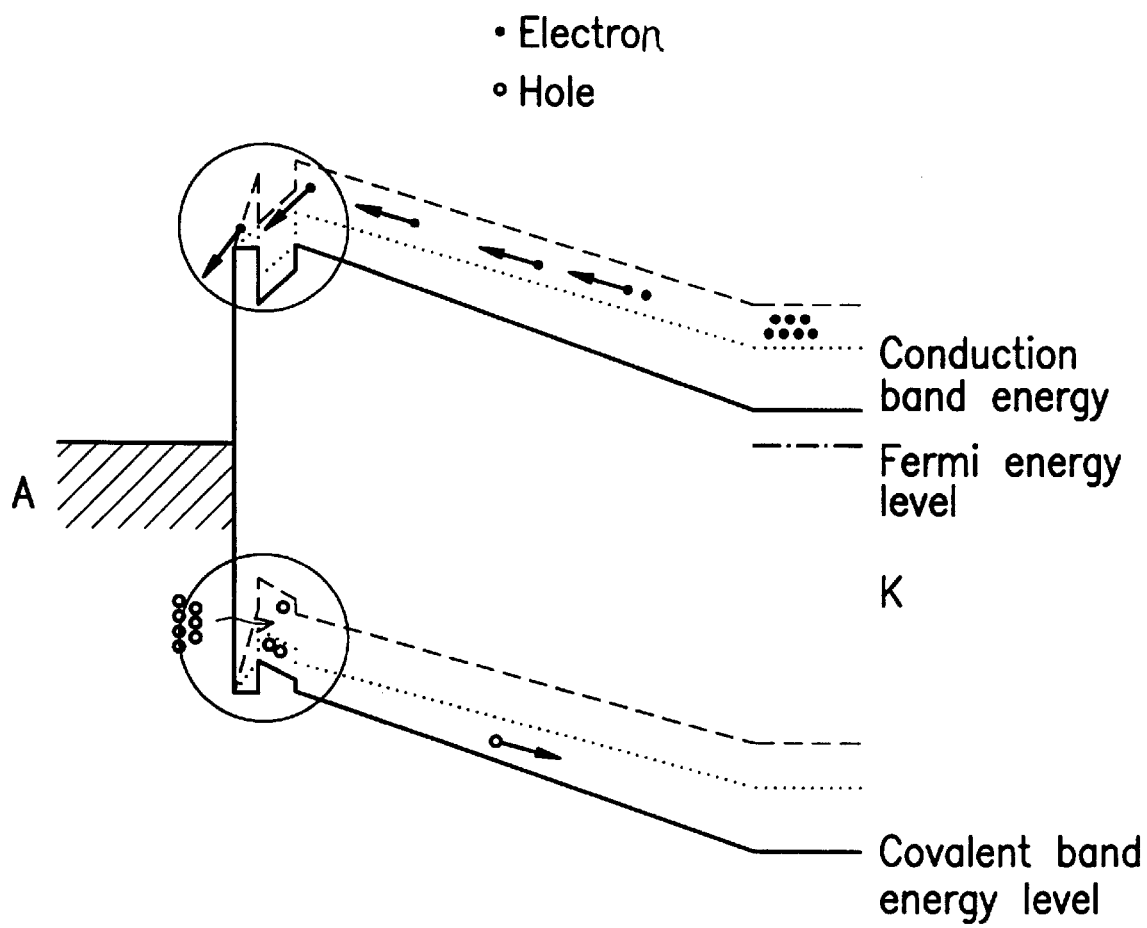
FIG. 6 shows an energy-band figure of the device of the present invention.
Figure 7:
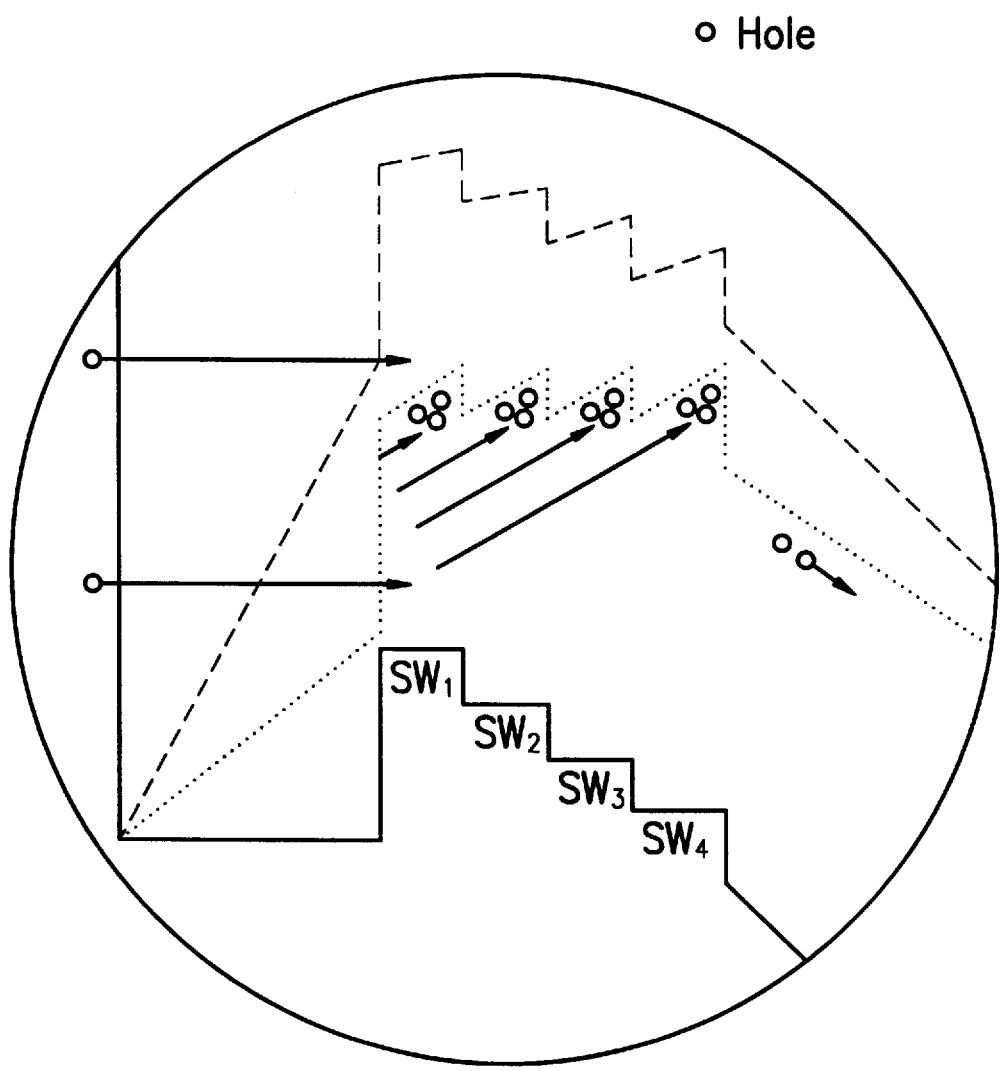
FIG. 7 shows the barrier-lowering and potential-redistribution corresponding to holes of the device of the present invention.
Figure 8:
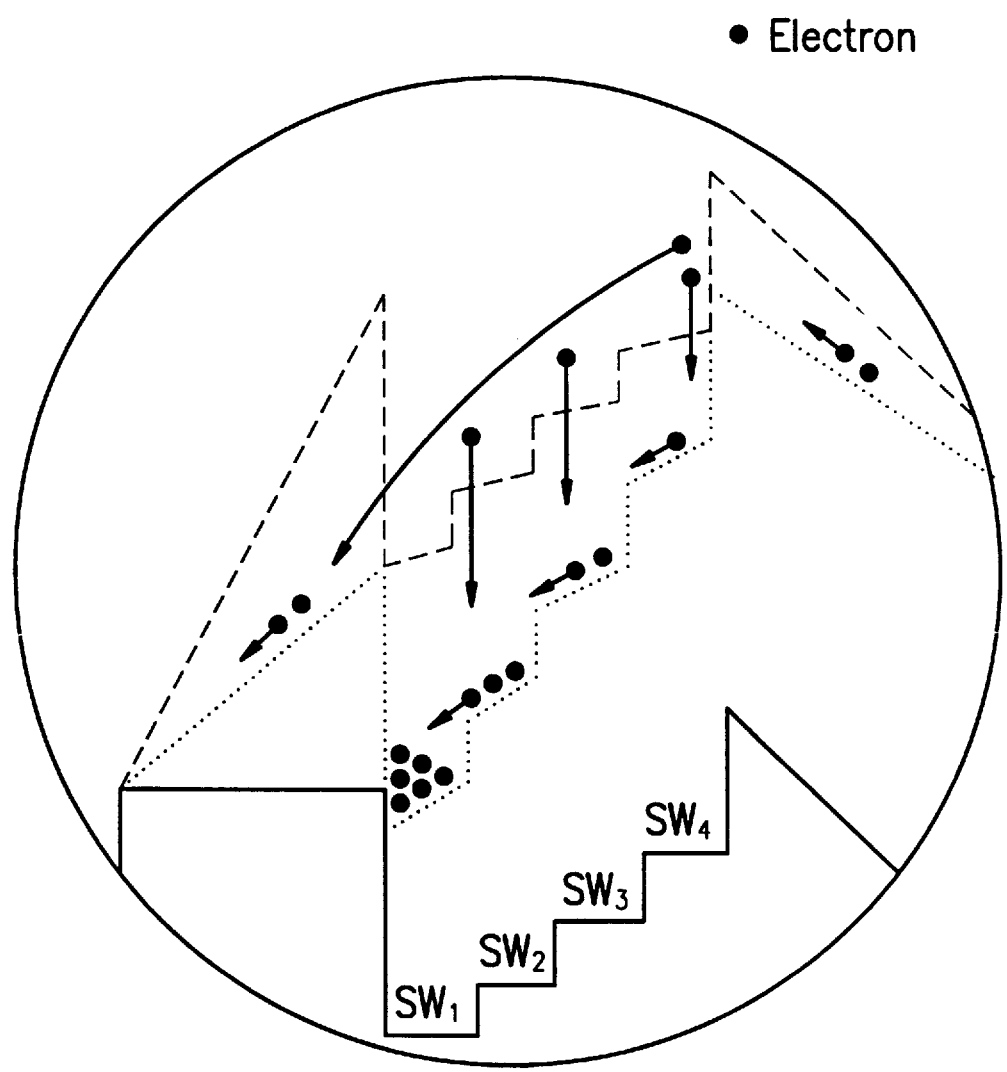
FIG. 8 shows the barrier-lowering and potential-redistribution corresponding to electrons of the device of the present invention.

The characteristics of the present invention can be learned from FIG. 6 to FIG. 8. The symbols appearing in FIG. 6 to FIG. 8 are respectively : "-", representing the case when no bias is applied; "--", representing the case when a positive bias is applied; ". . .", representing holes; and "o", representing electrons. FIG. 6 shows an energy-band figure of the device of the present invention, wherein the energy levels from top to bottom are respectively a "conducting band energy level", a "Fermi energy level", and a "covalent band energy level". When balanced, conducting currents can be negligible. FIG. 7 shows the barrier-lowering and potential-redistribution corresponding to holes of the device of the present invention. When a sufficient positive bias is applied, holes penetrating the MIS-like structure become a major current. The penetrating holes will be sequentially trapped at different subwells to produce successive barrier-lowering and potential-redistribution effects.

FIG. 8 shows the barrier lowering and potential redistribution corresponding to electrons according to the device of the present invention. The lowered barrier will enhance the conduction of electrons. In the process of the conduction of electrons, parts of electrons will be trapped at different subwells and accumulated therefore.

From above discussion, electrons will be directly accumulated at a first subwell, so S-type negative differential resistance will not appear. When a plurality of electrons are accumulated at the first quantum well, a potential redistribution will appear to cause a second route, as shown in FIG. 5.

The characteristics of the device of the present invention results from the successive accumulation and potential redistribution of conducting carriers when conducting carriers are trapped at the quantum well.

Having described the invention in connection with preferred embodiments, modifications will now doubtlessly be apparent to those skilled in this technology. The foregoing description of the preferred embodiments of the invention has been provided for the purposes of illustration and description. It is not intended to be exhaustive or to limit the invention to the precise embodiment disclosed herein. The disclosed embodiment has been chosen and described to best explain the principles of the invention and its practical application, thereby enabling others skilled in this technology to understand the invention, to practice various other embodiments thereof and to make various modifications suited to the particular use contemplated of the present invention. As such, it is intended that the scope of this invention shall not be limited to the disclosed, but rather shall be defined by the following claims and their equivalents.

What is claimed is:

1. A structure of an MIS-like MNDR device, wherein said MIS-like MNDR device has characteristics of the dual-route and MNDR at low temperatures, said MNDR device is capable of reducing said complexity of multiple-value logic circuitry, and said structure is formed on a wafer, said structure comprising:

a first layer, formed on said wafer;

a second layer, formed on said first layer, the second layer comprising four sublayers formed of n-doping InGaAs, and having a thickness of 200 Å and a doping concentration of $1 \times 10^{16}$ cm$^-$;

a third layer, formed on said second layer;

a first metal layer, formed on said third layer; and a second metal layer, formed on the back surface of said wafer.

2. The structure of claim 1, wherein said wafer comprises high n-doping GaAs.

3. The structure of claim 1, wherein said first layer comprises n-doping GaAs, and has a thickness of 5000Å.

4. The structure of claim 1, wherein said third layer is formed of n-doping GaAs, and has a thickness of 150Å and a doping concentration of $1 \times 10^{16}$ cm$^3$.

5. The structure of claim 1, wherein said first metal layer, evaporated of Au, serves as an anode.

6. The structure of claim 1, wherein said second metal layer, evaporated of Au—Ge—Ni alloy, serves as a cathode.

7. The structure of claim 1, wherein each of said four sublayers of said second layer has a thickness of 50Å, and said molar ratios of In and Ga in said four sublayers are respectively 5:95; 10:90; 15:85; 20:80.

* * * * *